United States Patent
Ye et al.

(10) Patent No.: US 10,032,805 B2
(45) Date of Patent: Jul. 24, 2018

(54) METHOD FOR BONDING PINS IN OUTER LEAD BONDING AREA

(71) Applicant: Shenzhen China Star Optoelectronics Technology Co., Ltd., Shenzhen (CN)

(72) Inventors: Yanxi Ye, Shenzhen (CN); Yunglun Lin, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 246 days.

(21) Appl. No.: 15/109,124

(22) PCT Filed: May 19, 2016

(86) PCT No.: PCT/CN2016/082674
§ 371 (c)(1),
(2) Date: Jun. 30, 2016

(87) PCT Pub. No.: WO2017/181469
PCT Pub. Date: Oct. 26, 2017

(65) Prior Publication Data
US 2018/0108681 A1    Apr. 19, 2018

(30) Foreign Application Priority Data
Apr. 20, 2016  (CN) .......................... 2016 1 0250792

(51) Int. Cl.
*H01L 27/12*     (2006.01)
*H01L 29/51*     (2006.01)
(Continued)

(52) U.S. Cl.
CPC ........ *H01L 27/1244* (2013.01); *G02F 1/1345* (2013.01); *G02F 1/1368* (2013.01);
(Continued)

(58) Field of Classification Search
CPC .................................................. H01L 27/1244
See application file for complete search history.

(56) References Cited

U.S. PATENT DOCUMENTS

| 8,476,634 B2 * | 7/2013 | Jeon | H01L 27/1248 257/59 |
| 2008/0088760 A1 * | 4/2008 | Kawano | G02F 1/133351 349/42 |
| 2013/0257841 A1 * | 10/2013 | Shim | G06F 3/038 345/212 |

FOREIGN PATENT DOCUMENTS

| KR | 20020088450 A | * 11/2002 |
| KR | 100780573 B1 | * 11/2007 |

* cited by examiner

*Primary Examiner* — Marvin Payen
(74) *Attorney, Agent, or Firm* — Leong C. Lei

(57) ABSTRACT

The present invention provides a method for bonding pins in OLB area, by forming via holes on the planarization layer of the OLB area corresponding to each pin, the subsequently formed connection wires connecting the pins through the via holes above the pins so that the corresponding pins being connected by the connection wires. As the connection wires completely cover the via holes above the pins, the problem of residual conductive material in the via holes during forming the connection wires does not occur. Compared to the known technology opening a large area on the planarization layer of the OLB area, the present invention avoids the conductive material residual at the bottom of the via hole on the planarization layer and related short circuit and poor display problems.

17 Claims, 7 Drawing Sheets

(51) Int. Cl.
*H01L 23/31* (2006.01)
*H01L 23/29* (2006.01)
*H01L 21/3213* (2006.01)
*H01L 21/311* (2006.01)
*G02F 1/1345* (2006.01)
*G02F 1/1368* (2006.01)
*H01L 21/768* (2006.01)
*G02F 1/1362* (2006.01)

(52) U.S. Cl.
CPC .. *G02F 1/136286* (2013.01); *H01L 21/31111* (2013.01); *H01L 21/32134* (2013.01); *H01L 21/76802* (2013.01); *H01L 23/291* (2013.01); *H01L 23/3171* (2013.01); *H01L 27/1248* (2013.01); *H01L 27/1288* (2013.01); *H01L 29/518* (2013.01); *G02F 2001/136295* (2013.01)

METHOD FOR BONDING PINS IN OUTER LEAD BONDING AREA

BACKGROUND OF THE INVENTION

1. Field of the Invention

The present invention relates to the field of display, and in particular to a method for bonding pins in the outer lead bonding (OLB) area.

2. The Related Arts

The active thin film transistor (TFT) liquid crystal display (LCD) are rapidly developed and widely applied in recent years. In general, the LCD panel comprises a color filter (CF) substrate, a TFT substrate, a liquid crystal (LC) sandwiched between the CF substrate and the TFT substrate, and a sealant. The operation theory of the LCD panel is to apply a driving voltage to the two glass substrates to control the rotation of the LC molecules in the LC layer to refract the light from the backlight module to generate an image.

There are three major types of TFT-LCD panels in the mainstream market, which are: twisted nematic (TN) or super twisted nematic (STN), in-plane switching (IPS), and vertical alignment (VA). The LCD panel of TV, due to the large size, often uses VA display technology and only a small fraction uses IPS display mode.

In the manufacturing process of LCD panel, the substrate with formed TFT must be covered with an organic polymer film on array (PFA) for planarization layer (PLN) to change the flatness of the surface of the lower film to prevent interference of electrical fields. The PLN layer is usually made of photosensitive material. The general VA mode, regardless of PVA, MVA or HVA, usually does not use organic film for PLN. However, if the VA mode technology is used with other technologies, the use of organic film for PLN is possible. However, ISP mode requires the use of organic film for PLN.

The LCD panel in normal display needs to use chip on film (COF) through pins to connect to the outer lead bonding (OLB) area of the panel so that the signals of the IC integrated on the COF pass through the OBL area to the panel. Specifically, as shown in FIG. 1, the OLB area comprises a base substrate, a plurality of first pins 110 formed and arranged in parallel on the base substrate, a gate insulating layer formed on the base substrate and the plurality of first pins 110, a plurality of second pins 120 formed opposite to the first pins 110 on the gate insulating layer, a passivation layer formed on the gate insulating layer and the plurality of second pins 120, and a planarization layer 200 formed on the passivation layer; during manufacturing, the part of the planarization layer 200 corresponding to the OLB area is first removed and a blank area 210 is formed on the planarization layer 200; then, as shown in FIG. 2, an ITO conductive layer is formed and patternized on the substrate to obtain a plurality of connection wires 130, each connection wire 130 connect the a first pin 110 in the black area 210 to a second pin 120, for connecting to the metal pin on the COF so that the signals of the IC integrated on the COF pass through the OBL area to the display panel. Wherein, the specific step of patternizing the indium-tin-oxide (ITO) conductive layer comprises: coating a photo-resist on the ITO conductive layer, using a mask to perform exposure and developing on the photo-resist to obtain photo-resist pattern; then using the remaining photo-resist as shielding, performing etching on the ITO conductive layer and stripping the remaining photo-resist to obtain a plurality of connection wire 130. However, as the planarization layer 200 is thick, the edge of the blank area 210 usually forms a taper angle. Therefore, after the exposure step in patternizing the ITO conductive layer, a residual photo-resist may remain at the taper of the blank area 210, leading to residual ITO 131 at the taper area, and as shown in FIG. 2, the residual ITO 131 will cause short circuit between the metal wires.

SUMMARY OF THE INVENTION

The object of the present invention is to provide a method for bonding pins in OLB area, improving the via design of the OLB area in the planarization layer to avoid short circuit and poor display resulted from the conductive material residual at the via bottom caused the residual photo-resist.

To achieve the above object, the present invention provides a method for bonding pins in OLB area, which comprises the following steps of:

Step 1: providing a TFT substrate, the TFT substrate comprising an active area and an outer lead bonding (OLB) area, and the OLB area comprising: a base substrate, a plurality of first pins formed and arranged in parallel on the base substrate, a gate insulating layer formed on the base substrate and the plurality of first pins, a plurality of second pins formed opposite to the first pins on the gate insulating layer, and a passivation layer formed on the gate insulating layer and the plurality of second pins;

Step 2: coating to form an organic film on the TFT substrate to obtain a planarization layer;

Step 3: forming at least a first via hole on the planarization layer, passivation layer and the gate insulating layer at the area corresponding to each first pin, and forming at least a second via hole on the planarization layer and passivation layer at the area corresponding to each second pin;

Step 4: forming a conductive layer on the planarization layer, patternizing the conductive layer to obtain a plurality of connection wires corresponding to the plurality of first pins and the plurality of second pins, each connection wire connecting to the corresponding first pin through the first via hole and connecting to the corresponding second pin through the second via hole to achieve connecting the corresponding the first pin to the corresponding second pin.

In Step 2, the formed organic film is made of a photo-resist material.

In Step 2, the thickness of the organic film is 1.5-3.5 um.

In Step 3, a first via hole is formed above each corresponding first pin, and a second via hole is formed above each corresponding second pin.

In Step 3, two first via holes are formed above each corresponding first pin, and two second via holes are formed above each corresponding second pin.

The gate insulating layer and the passivation layer are made of silicon nitride ($SiN_x$).

Specifically, Step 3 further comprises the following steps:

Step 31: providing a mask, the mask comprising a first pattern and a second pattern corresponding respectively to the plurality of first via holes and the plurality of second via holes, using the mask to perform exposure and development on the planarization layer to form a plurality of organic via holes corresponding to the first pattern and the second pattern on the planarization layer; and Step 32: using the planarization layer as a shielding layer to perform etching on the gate insulating layer and the passivation layer to obtain the first via hole and the second via hole.

In Step 4, the conductive layer is made of ITO.

In Step 4, the patternizing the conductive layer process comprises performing a wet etching process on the conductive layer.

The connection wires are for connecting to chips of chip on film (COF).

The present invention also provides a method for bonding pins in OLB area, which comprises the following steps of:

Step 1: providing a TFT substrate, the TFT substrate comprising an active area and an outer lead bonding (OLB) area, and the OLB area comprising: a base substrate, a plurality of first pins formed and arranged in parallel on the base substrate, a gate insulating layer formed on the base substrate and the plurality of first pins, a plurality of second pins formed opposite to the first pins on the gate insulating layer, and a passivation layer formed on the gate insulating layer and the plurality of second pins;

Step 2: coating to form an organic film on the TFT substrate to obtain a planarization layer;

Step 3: forming at least a first via hole on the planarization layer, passivation layer and the gate insulating layer at the area corresponding to each first pin, and forming at least a second via hole on the planarization layer and passivation layer at the area corresponding to each second pin;

Step 4: forming a conductive layer on the planarization layer, patternizing the conductive layer to obtain a plurality of connection wires corresponding to the plurality of first pins and the plurality of second pins, and each connection wire connecting to the corresponding first pin through the first via hole and connecting to the corresponding second pin through the second via hole to achieve connecting the corresponding the first pin to the corresponding second pin;

wherein in Step 2, the formed organic film is made of a photo-resist material;

wherein in Step 2, the thickness of the organic film is 1.5-3.5 um;

wherein Step 3 further comprising the following steps:

Step 31: providing a mask, the mask comprising a first pattern and a second pattern corresponding respectively to the plurality of first via holes and the plurality of second via holes, using the mask to perform exposure and development on the planarization layer to form a plurality of organic via holes corresponding to the first pattern and the second pattern on the planarization layer; and Step 32: using the planarization layer as a shielding layer to perform etching on the gate insulating layer and the passivation layer to obtain the first via hole and the second via hole.

Compared to the known techniques, the present invention provides a method for bonding pins in OLB area, by forming via holes on the planarization layer of the OLB area corresponding to each pin, the subsequently formed connection wires connecting the pins through the via holes above the pins so that the corresponding pins being connected by the connection wires. As the connection wires completely cover the via holes above the pins, the problem of residual conductive material in the via holes during forming the connection wires does not occur. Compared to the known technology opening a large area on the planarization layer of the OLB area, the present invention avoids the conductive material residual at the bottom of the via hole on the planarization layer and related short circuit and poor display problems.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technical means and effect of the present invention, the following refers to embodiments and drawings for detailed description.

Figure 1:
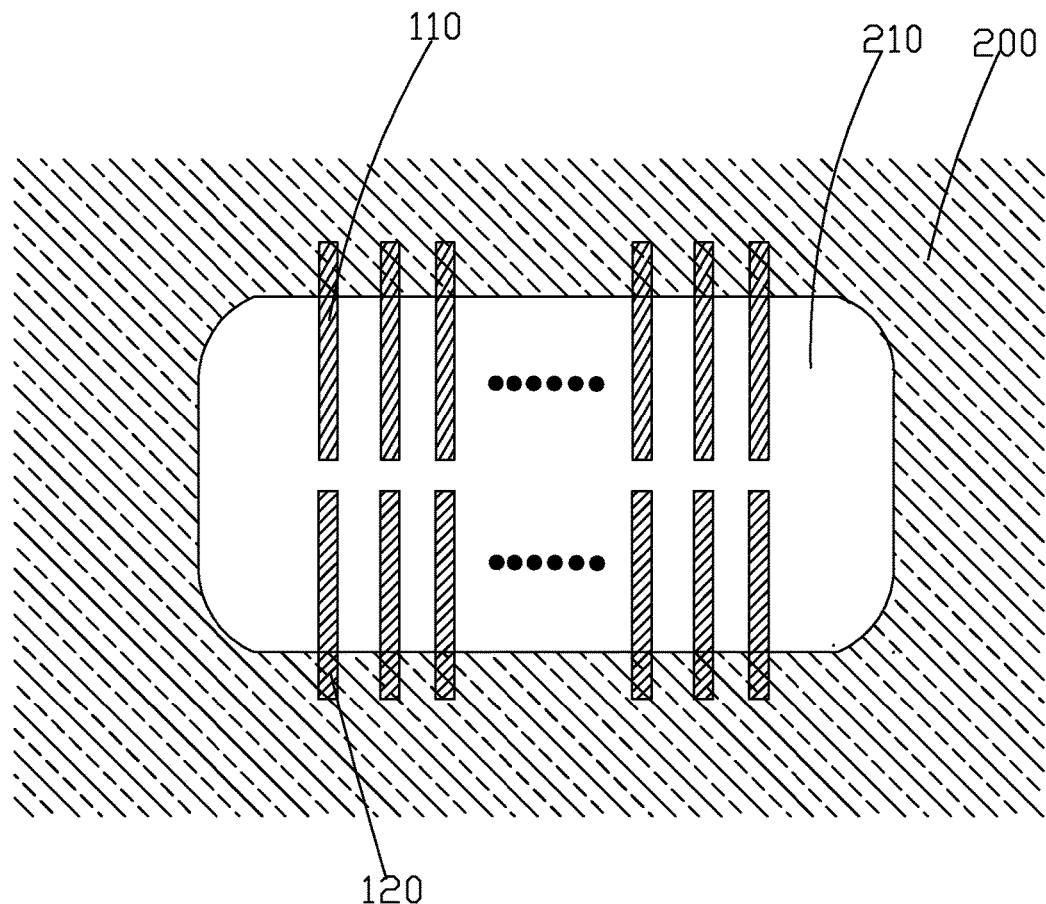
FIG. 1 is a schematic view showing a large area opening on the planarization layer corresponding to the OLB area in known method for bonding pins n OLB area.
Figure 2:
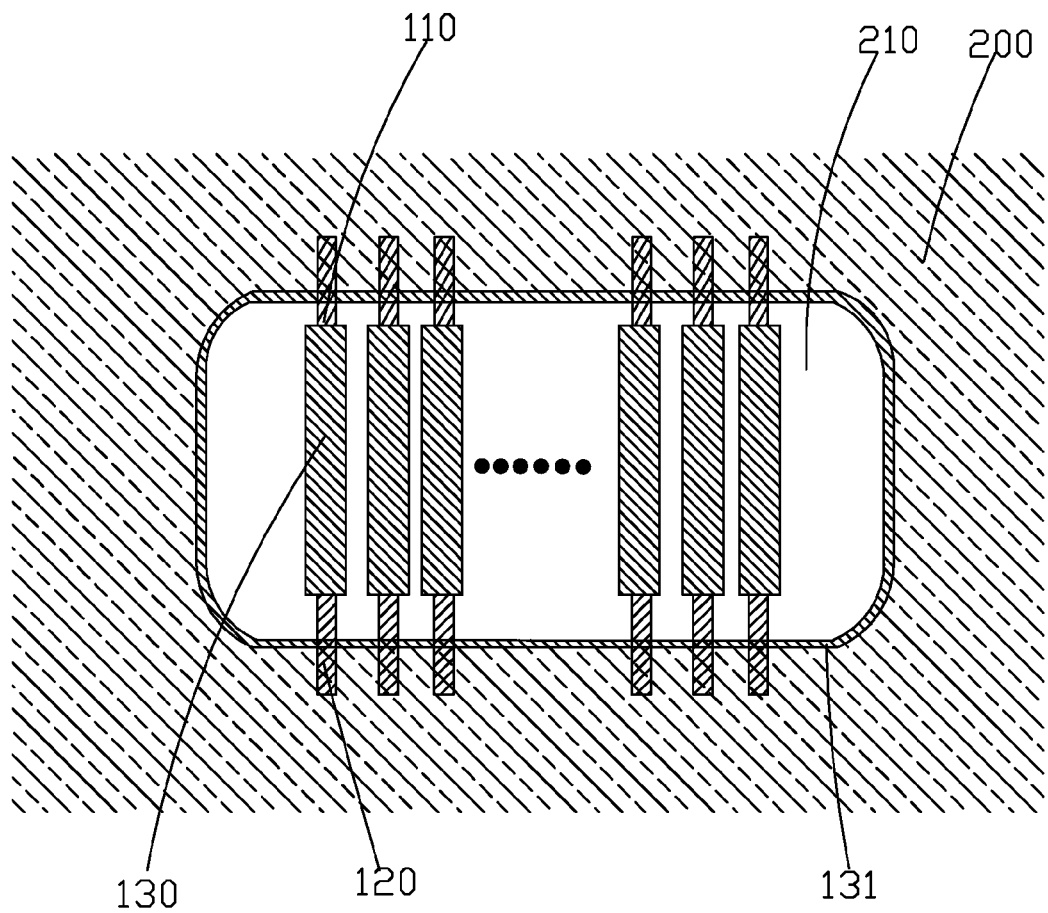
FIG. 2 is a schematic view showing the formation of connection wires in the OLB area in FIG. 1.
Figure 3:
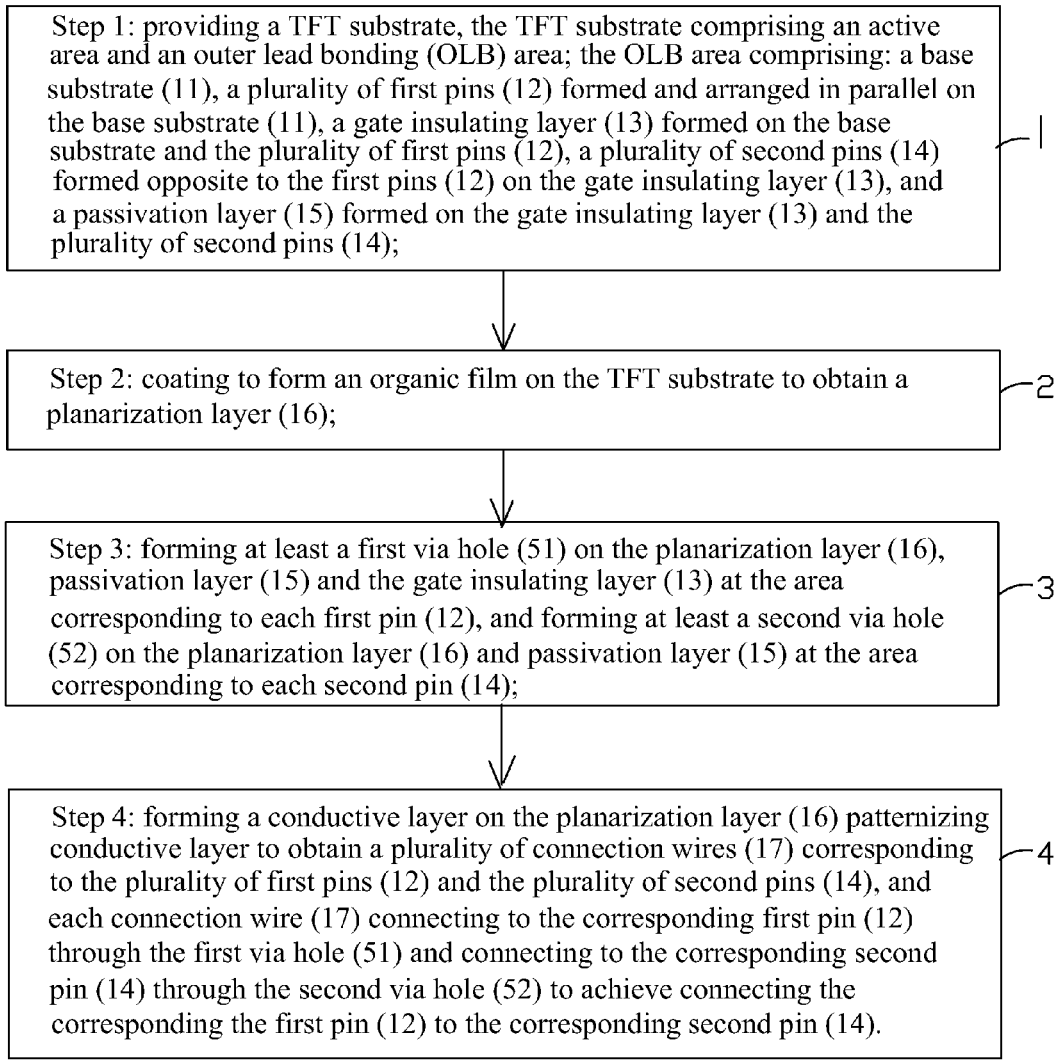
FIG. 3 is a schematic view showing a flowchart of the method for bonding pins in OLB area provided by an embodiment of the present invention.

Refer to FIG. 3. The present invention provides a method for bonding pins in OLB area, comprising the following steps:

Step 1: providing a TFT substrate, the TFT substrate comprising an active area and an outer lead bonding (OLB) area.

Figure 8:
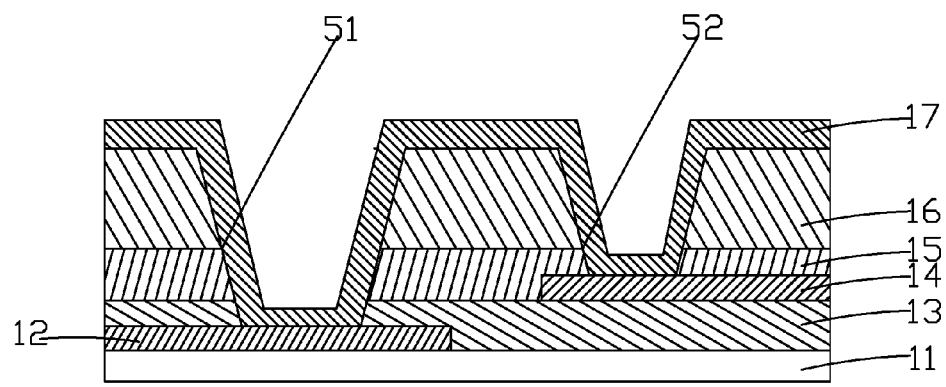
FIG. 8 is a schematic view showing the A-A' cross-section in FIG. 7.

As shown in FIG. 8, the OLB area comprises: a base substrate 11, a plurality of first pins 12 formed and arranged in parallel on the base substrate 11, a gate insulating layer 13 formed on the base substrate 11 and the plurality of first pins 12, a plurality of second pins 14 formed opposite to the first pins 12 on the gate insulating layer 13, and a passivation layer 15 formed on the gate insulating layer 13 and the plurality of second pins 14.

Specifically, the gate insulating layer 13 and the passivation layer 15 are made of silicon nitride ($SiN_x$).

Figure 4:
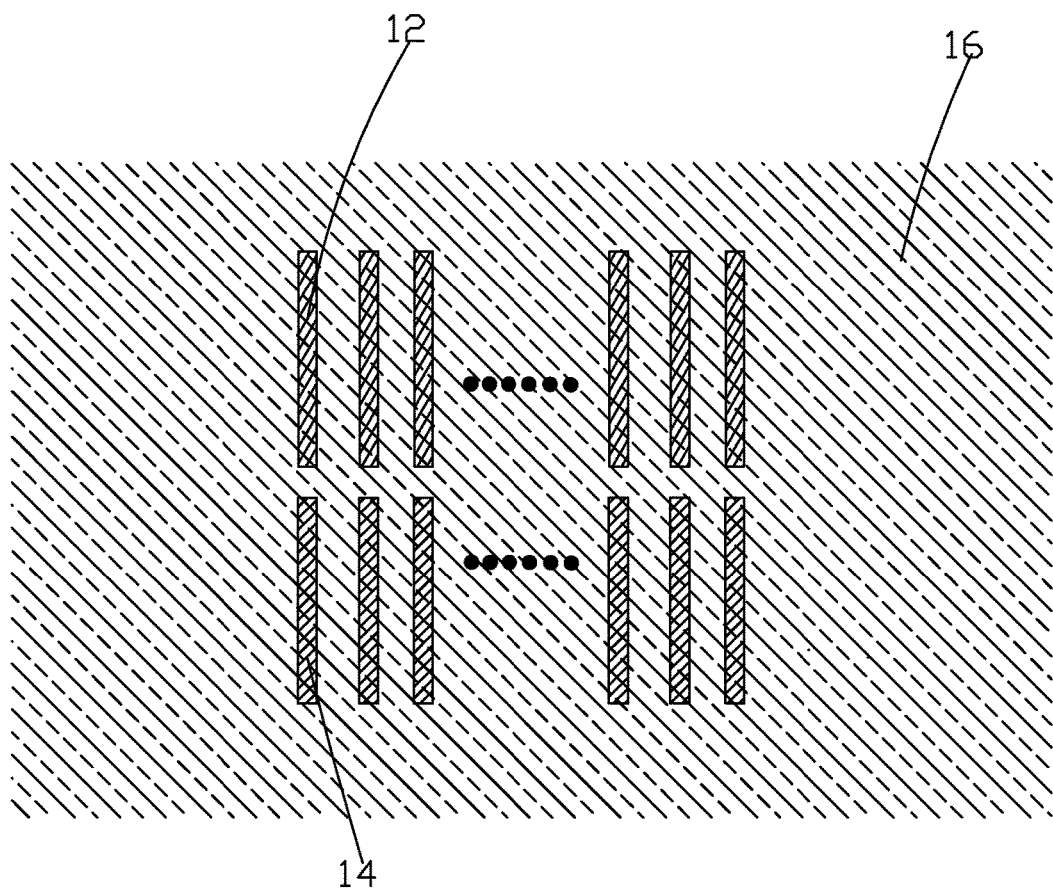
FIG. 4 is a schematic view showing the Step 2 of the method for bonding pins in OLB area provided by an embodiment of the present invention.

Step 2: as shown in FIG. 4, coating to form an organic film on the TFT substrate to obtain a planarization layer 16.

Specifically, the formed organic film is made of a photo-resist material, and the thickness of the organic film is 1.5-3.5 um, preferably, 2.5 um.

Figure 5:
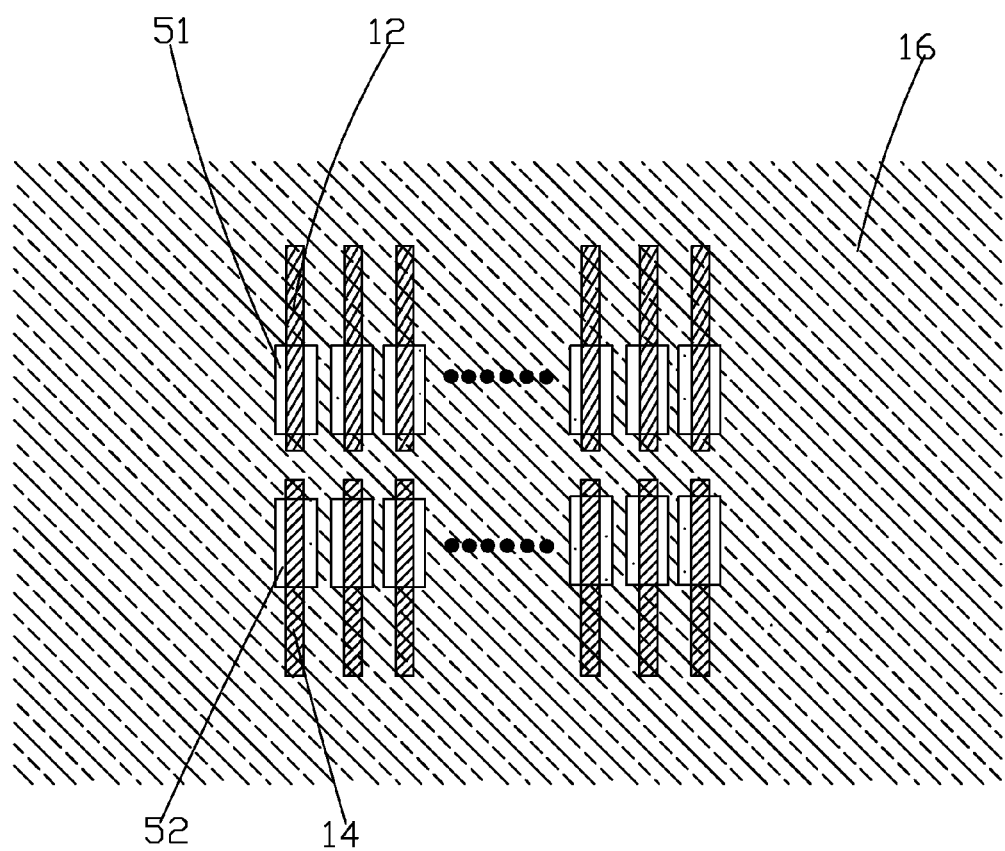
FIG. 5 is a schematic view showing Step 3 of the method for bonding pins in OLB area provided by a first embodiment of the present invention.

Step 3: as shown in FIG. 5, forming at least a first via hole 51 on the planarization layer 16, passivation layer 15 and the gate insulating layer 13 at the area corresponding to each first pin 12, and forming at least a second via hole 52 on the planarization layer 16 and passivation layer 15 at the area corresponding to each second pin 14.

Specifically, Step 3 further comprises the following steps:

Step 31: providing a mask, the mask comprising a first pattern and a second pattern corresponding respectively to the plurality of first via holes 51 and the plurality of second via holes 52, using the mask to perform exposure and development on the planarization layer 16 to form a plurality of organic via holes corresponding to the first pattern and the second pattern on the gate planarization layer 16.

Step 32: using the planarization layer 16 as a shielding layer to perform etching on the gate insulating layer 13 and the passivation layer 15 to obtain the first via hole 51 and the second via hole 52.

Figure 7:
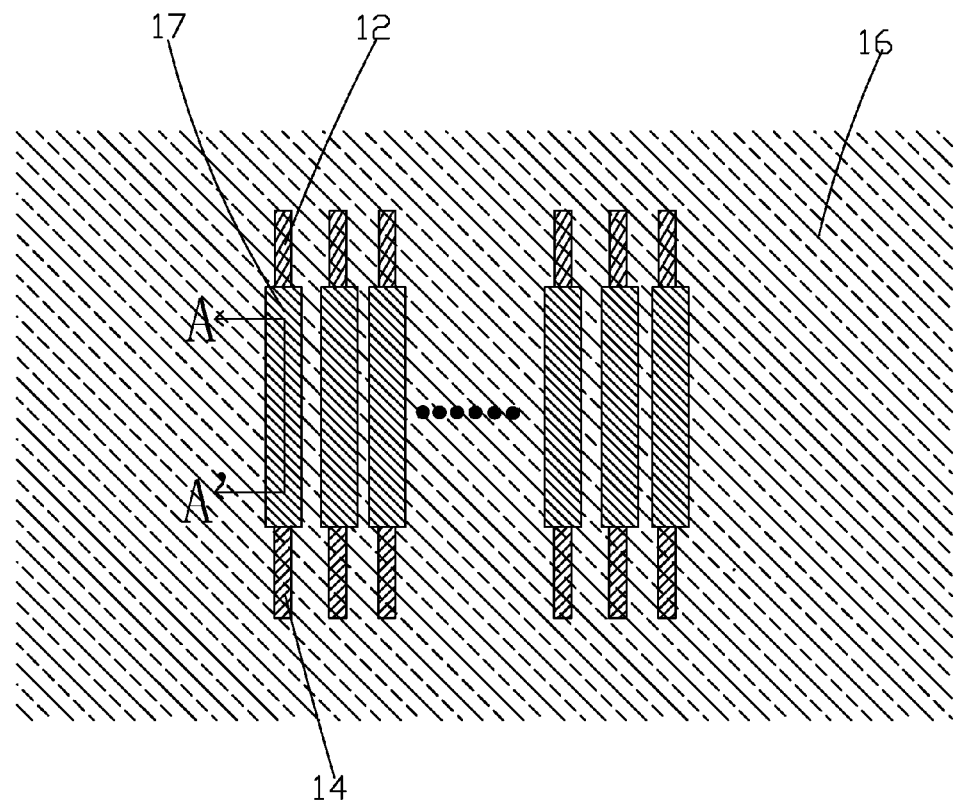
FIG. 7 is a schematic view showing Step 4 of the method for bonding pins in OLB area provided by the first embodiment of the present invention.

Step 4: as shown in FIGS. 7 and 8, forming a conductive layer on the planarization layer 16, patternizing the conductive layer to obtain a plurality of connection wires 17 corresponding to the plurality of first pins 12 and the plurality of second pins 14, and each connection wire 17 connecting to the corresponding first pin 12 through the first via hole 51 and connecting to the corresponding second pin 14 through the second via hole 52 to achieve connecting the corresponding the first pin 12 to the corresponding second pin 14.

Specifically, the steps of patternizing the conductive layer comprises: coating a photo-resist on the conductive layer, using a mask to perform exposure and development on the photo-resist to obtain photo-resist pattern; then using the remaining photo-resist as shielding, performing etching on the conductive layer and stripping the remaining photo-resist to obtain a plurality of connection wire 17. In subsequent process, the connection wires 17 are directly connected to the chip on film (COF) so that the signals of the chips on COF are passed through OLB area to the TFT substrate, and then to the entire panel.

Specifically, in Step 4, the conductive layer is made of indium-tin-oxide (ITO) and the patternizing the conductive layer process comprises performing a wet etching process on the conductive layer.

It should be noted that in the present invention, the connection wires 17 are connected to the corresponding first pins 12 through the first via holes 51, and connected to the corresponding second pins 14 through the second via holes 52 so as to achieve connecting the first pins 12 to corresponding second pins 14. As the connection wires 17 completely cover the first via holes 51 and the second via holes 52, the problem of residual conductive material during forming the connection wires 17 does not occur. Compared to the known technology opening a large area on the planarization layer of the OLB area, the present invention avoids the conductive material residual at the bottom of the via hole on the planarization layer and related short circuit and poor display problems.

As shown in FIG. 5 and FIG. 8, in Step 3 of the first embodiment of the present invention, one first via hole 51 is formed above each corresponding first pin 12, and one second via hole 52 is formed above each corresponding second pin 14.

Figure 6:
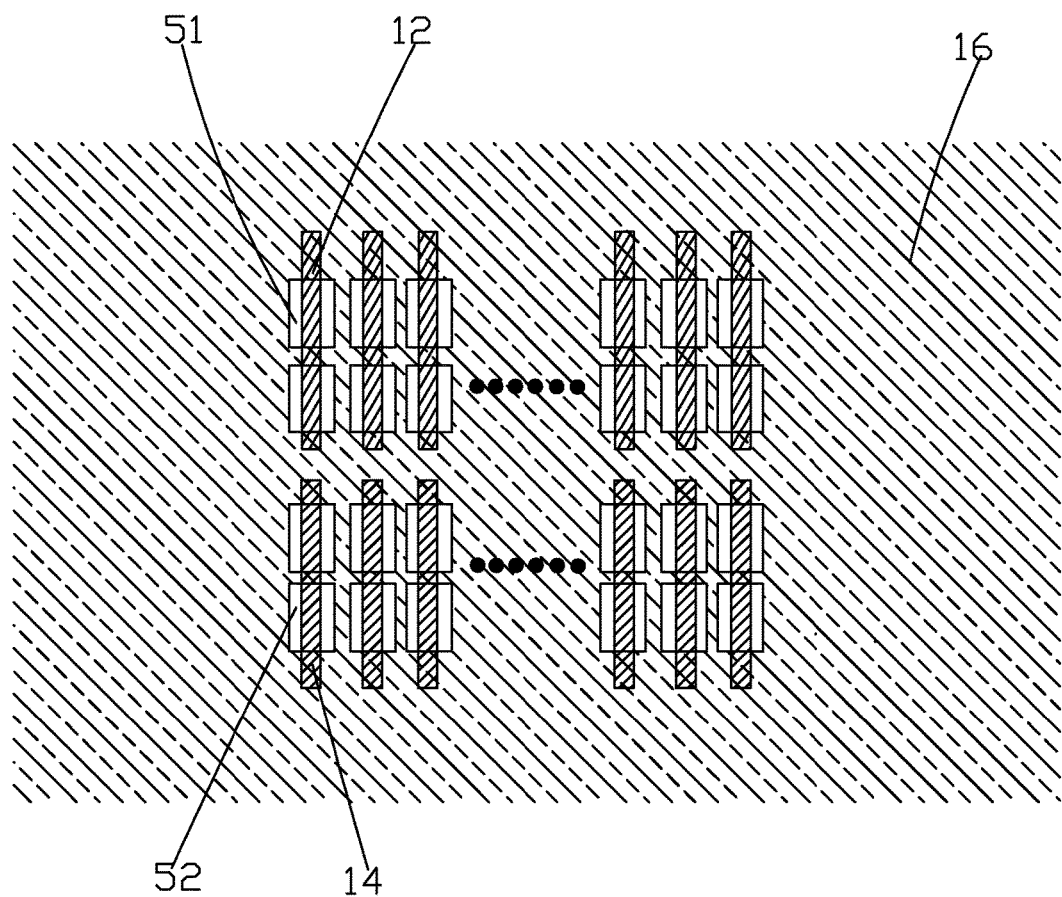
FIG. 6 is a schematic view showing Step 3 of the method for bonding pins in OLB area provided by a second embodiment of the present invention.

However, to reduce the resistance between each connection wire and the first pin 12 and the second pin 14, a plurality of first via holes 51 is formed above each corresponding first pin 12, and a plurality of second via holes 52 is formed above each corresponding second pin 14. As shown in FIG. 6, in Step 3 of the first embodiment of the present invention, two first via holes 51 are formed above each corresponding first pin 12, and two second via holes 52 are formed above each corresponding second pin 14. The remaining part of the second embodiment is the same as the first embodiment, and the detailed description is omitted.

In summary, the present invention provides a method for bonding pins in OLB area, by forming via holes on the planarization layer of the OLB area corresponding to each pin, the subsequently formed connection wires connecting the pins through the via holes above the pins so that the corresponding pins being connected by the connection wires. As the connection wires completely cover the via holes above the pins, the problem of residual conductive material in the via holes during forming the connection wires does not occur. Compared to the known technology opening a large area on the planarization layer of the OLB area, the present invention avoids the conductive material residual at the bottom of the via hole on the planarization layer and related short circuit and poor display problems.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A method for bonding pins in outer lead bonding (OLB) area, which comprises the following steps of:
   Step 1: providing a TFT substrate, the TFT substrate comprising an active area and an OLB area, and
   the OLB area comprising: a base substrate, a plurality of first pins formed and arranged in parallel on the base substrate, a gate insulating layer formed on the base substrate and the plurality of first pins, a plurality of second pins formed opposite to the first pins on the gate insulating layer, and a passivation layer formed on the gate insulating layer and the plurality of second pins;
   Step 2: coating to form an organic film on the TFT substrate to obtain a planarization layer;
   Step 3: forming at least a first via hole on the planarization layer, passivation layer and the gate insulating layer at the area corresponding to each first pin, and forming at least a second via hole on the planarization layer and passivation layer at the area corresponding to each second pin; and
   Step 4: forming a conductive layer on the planarization layer, patternizing the conductive layer to obtain a plurality of connection wires corresponding to the plurality of first pins and the plurality of second pins, each connection wire connecting to the corresponding first pin through the first via hole and connecting to the corresponding second pin through the second via hole to achieve connecting the corresponding the first pin to the corresponding second pin.

2. The method for bonding pins in OLB area as claimed in claim 1, wherein in Step 2, the formed organic film is made of a photo-resist material.

3. The method for bonding pins in OLB area as claimed in claim 2, wherein in Step 2, the thickness of the organic film is 1.5-3.5 um.

4. The method for bonding pins in OLB area as claimed in claim 1, wherein in Step 3, a first via hole is formed above each corresponding first pin, and a second via hole is formed above each corresponding second pin.

5. The method for bonding pins in OLB area as claimed in claim 1, wherein in Step 3, two first via holes are formed above each corresponding first pin, and two second via holes are formed above each corresponding second pin.

6. The method for bonding pins in OLB area as claimed in claim 1, wherein the gate insulating layer and the passivation layer are made of silicon nitride ($SiN_x$).

7. The method for bonding pins in OLB area as claimed in claim 1, wherein Step 3 further comprises the following steps:
   Step 31: providing a mask, the mask comprising a first pattern and a second pattern corresponding respectively to the plurality of first via holes and the plurality of second via holes, using the mask to perform exposure and development on the planarization layer to form a plurality of organic via holes corresponding to the first pattern and the second pattern on the planarization layer; and
   Step 32: using the planarization layer as a shielding layer to perform etching on the gate insulating layer and the passivation layer to obtain the first via hole and the second via hole.

8. The method for bonding pins in OLB area as claimed in claim 1, wherein in Step 4, the conductive layer is made of indium-tin-oxide (ITO).

9. The method for bonding pins in OLB area as claimed in claim 8, wherein in Step 4, the patternizing the conductive layer process comprises performing a wet etching process on the conductive layer.

10. The method for bonding pins in OLB area as claimed in claim 1, wherein the connection wires are for connecting to chips of chip on film (COF).

11. A method for bonding pins in outer lead bonding (OLB) area, which comprises the following steps of:
   Step 1: providing a TFT substrate, the TFT substrate comprising an active area and an OLB area, and
   the OLB area comprising: a base substrate, a plurality of first pins formed and arranged in parallel on the base substrate, a gate insulating layer formed on the base substrate and the plurality of first pins, a plurality of second pins formed opposite to the first pins on the gate insulating layer, and a passivation layer formed on the gate insulating layer and the plurality of second pins;
   Step 2: coating to form an organic film on the TFT substrate to obtain a planarization layer;
   Step 3: forming at least a first via hole on the planarization layer, passivation layer and the gate insulating layer at the area corresponding to each first pin, and forming at least a second via hole on the planarization layer and passivation layer at the area corresponding to each second pin; and
   Step 4: forming a conductive layer on the planarization layer, patternizing the conductive layer to obtain a plurality of connection wires corresponding to the plurality of first pins and the plurality of second pins, each connection wire connecting to the corresponding first pin through the first via hole and connecting to the corresponding second pin through the second via hole to achieve connecting the corresponding the first pin to the corresponding second pin;
   wherein in Step 2, the formed organic film is made of a photo-resist material;
   wherein in Step 2, the thickness of the organic film is 1.5-3.5 um;
   wherein Step 3 further comprising the following steps:
   Step 31: providing a mask, the mask comprising a first pattern and a second pattern corresponding respectively to the plurality of first via holes and the plurality of second via holes, using the mask to perform exposure and development on the planarization layer to form a plurality of organic via holes corresponding to the first pattern and the second pattern on the planarization layer; and
   Step 32: using the planarization layer as a shielding layer to perform etching on the gate insulating layer and the passivation layer to obtain the first via hole and the second via hole.

12. The method for bonding pins in OLB area as claimed in claim 11, wherein in Step 3, a first via hole is formed above each corresponding first pin, and a second via hole is formed above each corresponding second pin.

13. The method for bonding pins in OLB area as claimed in claim 11, wherein in Step 3, two first via holes are formed above each corresponding first pin, and two second via holes are formed above each corresponding second pin.

14. The method for bonding pins in OLB area as claimed in claim 11, wherein the gate insulating layer and the passivation layer are made of silicon nitride ($SiN_x$).

15. The method for bonding pins in OLB area as claimed in claim 11, wherein in Step 4, the conductive layer is made of indium-tin-oxide (ITO).

16. The method for bonding pins in OLB area as claimed in claim 15, wherein in Step 4, the patternizing the conductive layer process comprises performing a wet etching process on the conductive layer.

17. The method for bonding pins in OLB area as claimed in claim 11, wherein the connection wires are for connecting to chips of chip on film (COF).

* * * * *